(12) United States Patent
Huang et al.

(10) Patent No.: US 8,501,594 B2
(45) Date of Patent: *Aug. 6, 2013

(54) METHODS FOR FORMING SILICON GERMANIUM LAYERS

(75) Inventors: Yi-Chiau Huang, Fremont, CA (US); Masato Ishii, Sunnyvale, CA (US); Errol Sanchez, Tracy, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/815,503

(22) Filed: Jun. 15, 2010

(65) Prior Publication Data

US 2010/0317177 A1 Dec. 16, 2010

Related U.S. Application Data

(60) Continuation of application No. 12/270,630, filed on Nov. 13, 2008, now abandoned, and a continuation-in-part of application No. 12/201,681, filed on Aug. 29, 2008, now Pat. No. 7,737,007, which is a continuation of application No. 11/539,775, filed on Oct. 9, 2006, now Pat. No. 7,439,142, which is a division of application No. 10/845,984, filed on May 14, 2004, now Pat. No. 7,132,338, which is a continuation-in-part of application No. 10/683,937, filed on Oct. 10, 2003, now Pat. No. 7,166,528.

(51) Int. Cl.
*H01L 21/20* (2006.01)

(52) U.S. Cl.
USPC ....... 438/481; 438/503; 438/504; 257/E21.09

(58) Field of Classification Search
USPC .......................................... 438/481, 503, 504
See application file for complete search history.

(56) References Cited

U.S. PATENT DOCUMENTS

| 4,834,831 A | 5/1989 | Nishizawa et al. |
| 5,112,439 A | 5/1992 | Reisman et al. |

(Continued)

FOREIGN PATENT DOCUMENTS

| EP | 1 150 345 A2 | 10/2001 |
| JP | 58-098917 | 6/1983 |

(Continued)

OTHER PUBLICATIONS

Choi, et al. "Stability of $TiB_2$ as a Diffusion Barrier on Silicon," J. Elecrochem. Soc., vol. 138, No. 10, Oct. 1991.

(Continued)

*Primary Examiner* — Alexander Ghyka
(74) *Attorney, Agent, or Firm* — Moser Taboada; Alan Taboada

(57) ABSTRACT

Embodiments of methods for depositing silicon germanium (SiGe) layers on a substrate are disclosed herein. In some embodiments, the method may include depositing a first layer comprising silicon and germanium (e.g., a seed layer) atop the substrate using a first precursor comprising silicon and chlorine; and depositing a second layer comprising silicon and germanium (e.g., a bulk layer) atop the silicon germanium seed layer using a second precursor comprising silicon and hydrogen. In some embodiments, the first silicon precursor gas may comprise at least one of dichlorosilane ($H_2SiCl_2$), trichlorosilane ($HSiCl_3$), or silicon tetrachloride ($SiCl_4$). In some embodiments, the second silicon precursor gas may comprise at least one of silane ($SiH_4$), or disilane ($Si_2H_6$).

20 Claims, 2 Drawing Sheets

U.S. PATENT DOCUMENTS

| | | | |
|---|---|---|---|
| 5,273,930 A | 12/1993 | Steele et al. | |
| 5,294,286 A | 3/1994 | Nishizawa et al. | |
| 5,372,860 A | 12/1994 | Fehlner et al. | |
| 5,374,570 A | 12/1994 | Nasu et al. | |
| 5,469,806 A | 11/1995 | Mochizuki et al. | |
| 5,480,818 A | 1/1996 | Matsumoto et al. | |
| 5,527,733 A | 6/1996 | Nishizawa et al. | |
| 5,674,304 A | 10/1997 | Fukada et al. | |
| 5,693,139 A | 12/1997 | Nishizawa et al. | |
| 5,796,116 A | 8/1998 | Nakata et al. | |
| 5,807,792 A | 9/1998 | Ilg et al. | |
| 5,846,867 A * | 12/1998 | Gomi et al. | 438/318 |
| 5,906,680 A | 5/1999 | Meyerson | |
| 6,025,627 A | 2/2000 | Forbes et al. | |
| 6,042,654 A | 3/2000 | Comita et al. | |
| 6,159,852 A | 12/2000 | Nuttall et al. | |
| 6,232,196 B1 | 5/2001 | Raaijmakers et al. | |
| 6,235,568 B1 | 5/2001 | Murthy et al. | |
| 6,284,686 B1 | 9/2001 | Marlor | |
| 6,291,319 B1 | 9/2001 | Yu et al. | |
| 6,335,280 B1 | 1/2002 | van der Jeugd | |
| 6,348,420 B1 | 2/2002 | Raaijmakers et al. | |
| 6,352,945 B1 | 3/2002 | Matsuki et al. | |
| 6,358,829 B2 | 3/2002 | Yoon et al. | |
| 6,383,955 B1 | 5/2002 | Matsuki et al. | |
| 6,410,463 B1 | 6/2002 | Matsuki | |
| 6,451,119 B2 | 9/2002 | Sneh et al. | |
| 6,458,718 B1 | 10/2002 | Todd | |
| 6,489,241 B1 | 12/2002 | Thilderkvist et al. | |
| 6,492,711 B1 | 12/2002 | Takagi et al. | |
| 6,544,900 B2 | 4/2003 | Raaijmakers et al. | |
| 6,559,520 B2 | 5/2003 | Matsuki et al. | |
| 6,562,720 B2 | 5/2003 | Thilderkvist et al. | |
| 6,797,558 B2 | 9/2004 | Nuttall et al. | |
| 6,821,825 B2 | 11/2004 | Todd | |
| 7,132,338 B2 * | 11/2006 | Samoilov et al. | 438/300 |
| 7,166,528 B2 | 1/2007 | Kim et al. | |
| 7,439,142 B2 | 10/2008 | Samoilov et al. | |
| 7,737,007 B2 | 6/2010 | Samoilov et al. | |
| 8,012,859 B1 * | 9/2011 | Joe et al. | 438/478 |
| 2001/0020712 A1 | 9/2001 | Raaijmakers et al. | |
| 2001/0024871 A1 | 9/2001 | Yagi | |
| 2001/0045604 A1 | 11/2001 | Oda et al. | |
| 2001/0046567 A1 | 11/2001 | Matsuki et al. | |
| 2001/0055672 A1 | 12/2001 | Todd | |
| 2002/0090818 A1 | 7/2002 | Thilderkvist et al. | |
| 2002/0093042 A1 | 7/2002 | Oh et al. | |
| 2002/0145168 A1 | 10/2002 | Bojarczuk, Jr. et al. | |
| 2002/0168868 A1 | 11/2002 | Todd | |
| 2002/0173113 A1 | 11/2002 | Todd et al. | |
| 2002/0173130 A1 | 11/2002 | Pomarede et al. | |
| 2002/0197831 A1 | 12/2002 | Todd et al. | |
| 2003/0022528 A1 | 1/2003 | Todd | |
| 2003/0036268 A1 | 2/2003 | Brabant et al. | |
| 2003/0082300 A1 | 5/2003 | Todd et al. | |
| 2003/0189208 A1 | 10/2003 | Law et al. | |
| 2004/0033674 A1 | 2/2004 | Todd | |
| 2004/0188684 A1 * | 9/2004 | Glass et al. | 257/65 |
| 2004/0226911 A1 | 11/2004 | Dutton et al. | |
| 2004/0253776 A1 | 12/2004 | Hoffmann et al. | |
| 2005/0079691 A1 | 4/2005 | Kim et al. | |
| 2007/0003698 A1 * | 1/2007 | Chen et al. | 427/248.1 |
| 2007/0082451 A1 * | 4/2007 | Samoilov et al. | 438/301 |
| 2008/0026549 A1 | 1/2008 | Kim et al. | |
| 2010/0120235 A1 * | 5/2010 | Huang et al. | 438/483 |

FOREIGN PATENT DOCUMENTS

| | | |
|---|---|---|
| JP | 62-171999 | 7/1987 |
| JP | 63-062313 | 3/1988 |
| JP | 01-270593 | 10/1989 |
| JP | 02-172895 | 7/1990 |
| JP | 03-286522 | 12/1991 |
| JP | 05-047665 | 2/1993 |
| JP | 05-102189 | 4/1993 |
| JP | 2001-189312 | 5/2001 |
| JP | 2001-111000 | 12/2002 |
| WO | WO 98/20524 | 5/1998 |
| WO | WO 01/41544 A2 | 6/2001 |
| WO | WO 02/064853 A2 | 8/2002 |
| WO | WO 02/065508 A2 | 8/2002 |
| WO | WO 02/065516 A2 | 8/2002 |
| WO | WO 02/065517 A2 | 8/2002 |
| WO | WO 02/065525 A1 | 8/2002 |
| WO | WO 02/080244 A2 | 10/2002 |
| WO | WO 02/097864 A2 | 12/2002 |
| WO | WO 2005/038890 A1 | 4/2005 |

OTHER PUBLICATIONS

Article by Kamins et al., entitled "Kinetics of Selective epitaxial deposition $Si_{1-x}Ge_x$,", American Institute of Physics, Aug. 1992, No. 6, pp. 669-671.

Article by Sedgwick et al., entitled "Selective SiGe and heavily as doped Si deposited at low temperature by atmospheric pressure chemical vapor deposition", Journal of Vacuum Science and Technology, May/Jun. 1993, No. 3, pp. 1124-1128.

Article by Uchino et al, entitled "A Raised Source/Drain Technology Using In-situ P-Doped SiGe and B-doped Si for 0.1 μm CMOS ULSIs", IEDM, Dec. 1997, Technical Digest, pp. 479-482.

Lee, et al. Cyclic Technique for the Enhancement of Highly Oriented Diamond film Growth, : Thin Solid Films 303 (1997) 264-269.

Jeong, et al. "Growth and Characterization of Aluminum Oxide $Al_2O_3$ Thin Films by Plasma-assisted Atomic Layer Controlled Deposition," J. Korean Inst. Met. Mater., vol. 38, No. 10, Oct. 2000.

Jeong, et al. "Plasma-assisted Atomic Layer Growth of High-Quality Aluminum Oxide Thin Films," Jp. J. Appl. Phys. 1, Regul. Pap. Short Notes, vol. 40, No. 1, Jan. 2001.

Paranjpe, et al. "Atomic Layer Deposition of $AlO_x$ for Thin Film Head Gap Applications," J. Electrochem. Soc., vol. 148, No. 9, Sep. 2001.

Article by Menon et al., entitled "Loading effect in SiGE layers grown by dichlorosilane-and silane-based epitaxy", American Institute of Physics, Nov. 2001, vol. 90, No. 9, pp. 4805-4809.

Invitation to Pay Additional Fees and Partial International Search Report for PCT/US2005/016160.

International Search Report mailed Feb. 22, 2005 for PCT/US2004/030872.

International Search Report dated Mar. 30, 2006 for International Application No. PCT/US2005/016160.

Written Opinion of the International Searching Authority dated Mar. 30, 2006 for International Application No. PCT/US2005/016160.

* cited by examiner

METHODS FOR FORMING SILICON GERMANIUM LAYERS

CROSS-REFERENCE TO RELATED APPLICATIONS

This application is a continuation-in-part of U.S. patent application Ser. No. 12/201,681, filed Aug. 29, 2008, which is a continuation of U.S. patent application Ser. No. 11/539,775, filed Oct. 9, 2006, now U.S. Pat. No. 7,439,142, which is a divisional of U.S. patent application Ser. No. 10/845,984, filed May 14, 2004, now U.S. Pat. No. 7,132,338, which is a continuation-in-part of U.S. patent application Ser. No. 10/683,937, filed Oct. 10, 2003, now U.S. Pat. No. 7,166,528, each of which are herein incorporated by reference in their entireties. This application is also a continuation of U.S. patent application Ser. No. 12/270,630, filed Nov. 13, 2008.

FIELD

Embodiments of the present invention generally relate to semiconductor processing, and more specifically to methods for depositing silicon germanium (SiGe) layers on substrates.

BACKGROUND

Silicon germanium (SiGe) layers may be utilized in semiconductor devices in many applications, such as for source/drain regions, source/drain extensions, contact plugs, a base layer of a bipolar device, or the like. Typically, SiGe layers may be epitaxially grown utilizing either dichlorosilane or silane as a silicon-containing precursor along with a germanium precursor. SiGe layers grown with dichlorosilane typically result in layers having a smooth surface, but with undesirably slow deposition rates. Thus, dichlorosilane precursors undesirably limit process throughput. Alternatively, SiGe layers may be grown using silane precursors, which tend to increase the deposition rate. However, such deposited layers typically have an undesirably rough surface. SiGe layers having rough surfaces may result in poor electrical contact with adjacent layers coupled thereto. In addition, the rough surface can result in device breakdown, or poor power consumption in devices utilizing such SiGe layers.

Thus, there is a need in the art for a method of depositing a silicon germanium (SiGe) layer on a substrate with a high deposition rate and having a smooth surface and desired properties.

SUMMARY

Embodiments of methods for depositing silicon germanium (SiGe) layers on a substrate are disclosed herein. In some embodiments, the method may include depositing a first layer comprising silicon and germanium (e.g., a seed layer) atop the substrate using a first precursor comprising silicon and chlorine; and depositing a second layer comprising silicon and germanium (e.g., a bulk layer) atop the silicon germanium seed layer using a second precursor comprising silicon and hydrogen. In some embodiments, the first silicon precursor gas may comprise at least one of dichlorosilane ($H_2SiCl_2$), trichlorosilane ($HSiCl_3$), or silicon tetrachloride ($SiCl_4$). In some embodiments, the second silicon precursor gas may comprise at least one of silane ($SiH_4$), or disilane ($Si_2H_6$).

In some embodiments, a computer readable medium having instructions stored thereon is provided. In some embodiments the instructions, when executed by a processor, cause a semiconductor process tool to perform a method of forming a silicon germanium layer depositing a first layer comprising silicon and germanium atop the substrate using a first precursor comprising silicon and chlorine; and depositing a second layer comprising silicon and germanium atop the first layer using a second precursor comprising silicon and hydrogen, wherein the first layer and the second layer form the silicon germanium layer.

BRIEF DESCRIPTION OF THE DRAWINGS

So that the manner in which the above recited features of the present invention can be understood in detail, a more particular description of the invention may be had by reference to the appended drawings and the discussion thereof in further detail, below. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The above drawings are not to scale and may be simplified for illustrative purposes.

DETAILED DESCRIPTION

Methods for depositing silicon germanium (SiGe) layers on a substrate are described herein. The methods include forming a silicon-containing compound layer by depositing a silicon germanium (SiGe) seed layer (e.g., a first layer) on the substrate using a first precursor gas and depositing a silicon germanium (SiGe) bulk layer (e.g., a second layer) atop the SiGe seed layer using a second precursor gas. The inventive methods advantageously facilitate the deposition of SiGe layers at high deposition rates and having smooth surfaces. The inventive methods further facilitate formation of SiGe layers having desired properties, such as, surface morphology, desired strain, lattice constants, improved device performance, and the like.

Figure 1:
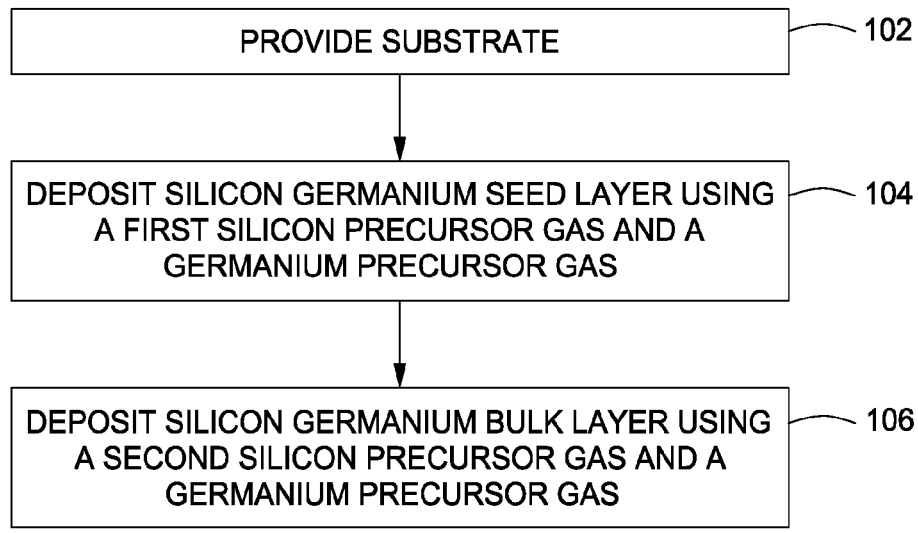
FIG. 1 depicts a flow chart of a method for depositing a silicon germanium layer on a substrate in accordance with some embodiments of the present invention.
Figure 2A:
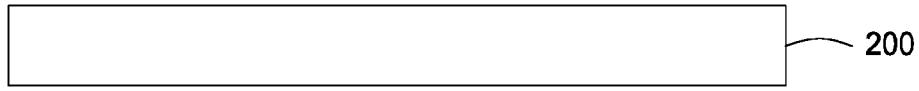
FIGS. 2A-C depict a substrate during various stages of the method as referred to in FIG. 1.

FIG. 1 illustrates a flow chart of a method 100 for depositing a silicon germanium layer on a substrate. The method 100 may be performed in any suitable process chamber configured for deposition of silicon germanium layers, such as the RP EPI reactor, available from Applied Materials, Inc. of Santa Clara, Calif., or such as the process chamber 300 described below with respect to FIG. 3. The method 100 is described below with respect to FIGS. 2A-C, which illustrate schematic side views of a substrate during various stages of the method as referred to in FIG. 1.

The method 100 generally begins at 102, where a substrate 200 is provided. The substrate 200 refers to any substrate or material surface upon which a film processing is performed. In some embodiments, the substrate 200 may comprise silicon, crystalline silicon (e.g., Si<100> or Si<111>), strained silicon, silicon germanium, doped or undoped polysilicon, doped or undoped silicon wafers, patterned or non-patterned wafers, silicon on insulator (SOI), doped silicon, or the like.

In some embodiments, the substrate 200 may have various dimensions, such as 200 or 300 mm diameter wafers, as well as rectangular or square panels. In some embodiments, the substrate 200 comprises silicon. The substrate 200 may be patterned and/or may contain multiple materials layers. For example, in some embodiments, the patterning may comprise a patterned photomask or the like.

Figure 2B:
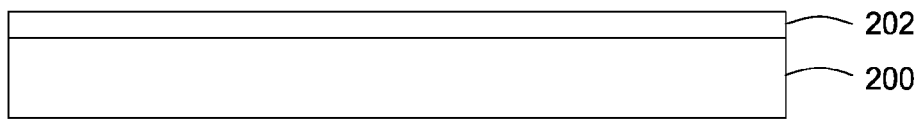

At 104, a silicon germanium seed layer 202 (e.g., a first layer comprising silicon and germanium) is deposited atop the substrate 200 (see FIG. 2B). The silicon germanium seed layer 202 may be utilized to, for example, cover defects in the surface of the substrate 200 and provide a smooth surface from which to grow a bulk SiGe layer. Specifically, the substrate 200 may comprise defects or contaminants arising, for example, from patterning processes, manufacturing and/or handling of the substrate, or the like.

In some embodiments, where a patterned substrate is used, the SiGe seed layer 202 may be deposited on an exposed portion of the substrate surface. In some embodiments, the SiGe seed layer 202 is deposited at a first deposition rate between about 25 to about 150 Angstroms/minute. The seed layer 202 may be deposited to any suitable thickness, for example, sufficient to cover any defects or to provide a smooth surface for subsequent deposition of a bulk SiGe layer (as described below). In some embodiments, the seed layer 202 is deposited to a thickness of up to about 100 Angstroms. The concentration of germanium in the SiGe seed layer 202 may be between about 10 to about 35 percent.

The silicon germanium seed layer 202 is deposited atop the substrate 200 using a first process gas mixture including a first silicon precursor gas and a germanium precursor gas. The first silicon precursor may be utilized for depositing the silicon element of the silicon germanium SiGe seed layer 202. The first silicon precursor may comprise silicon, chlorine, and hydrogen. In some embodiments, the first silicon precursor includes at least one of dichlorosilane ($H_2SiCl_2$), trichlorosilane ($HSiCl_3$), silicon tetrachloride ($SiCl_4$), or the like. In some embodiments, the first silicon precursor comprises dichlorosilane ($H_2SiCl_2$). The first silicon precursor may be combined with a germanium precursor for depositing the silicon germanium (SiGe) seed layer 202. The germanium precursor may include at least one of germane ($GeH_4$), germanium tetrachloride ($GeCl_4$), silicon tetrachloride ($SiCl_4$), or the like. In some embodiments, the germanium precursor comprises germane ($GeH_4$). In some embodiments, the silicon germanium seed layer 202 is deposited at a pressure of about 5 to about 15 Torr. In some embodiments, the silicon germanium seed layer 202 is deposited at a temperature of about 700 to about 750 degrees Celsius.

The first silicon precursor and the germanium precursor may be flowed simultaneously in a first process gas mixture, and utilized to form the SiGe seed layer 202 atop the substrate 200. In some embodiments, the first process gas mixture may further include a dilutant/carrier gas. The dilutant/carrier gas may include at least one of hydrogen ($H_2$), nitrogen ($N_2$), helium (He), argon (Ar), or the like. In some embodiments, the dilutant/carrier gas comprises hydrogen ($H_2$). The first process gas mixture may further include an etch gas to be a selective process. The etch gas may include at least one of hydrogen chloride (HCl), chlorine ($Cl_2$), or the like. In some embodiments, the inert gas comprises hydrogen chloride (HCl), In some embodiments, the first process gas mixture for the deposition of the silicon germanium seed layer 202 may be supplied at a total gas flow from about 10000 to about 35000 sccm, or at about 25000 sccm. The first process gas mixture may utilize a range of compositions. In some embodiments, the first process gas mixture may comprise between about 0.1 to about 1 percent of the first silicon precursor (e.g., a first silicon precursor flow of between about 25 to about 250 sccm). In some embodiments, the first process gas mixture may comprise between about 0.004 to about 0.02 percent of the germanium precursor (e.g., a germanium precursor gas flow of between about 1 to about 5 sccm). In some embodiments, the first process gas mixture may comprise between about 0.1 to about 1 percent of the etch gas (e.g., an etch gas flow of between about 25 to about 250 sccm). In some embodiments, the first process gas mixture may comprise between about 98 to about 99.9 percent of the dilutant/carrier gas. For example, in one specific embodiment, a first silicon precursor comprising dichlorosilane ($H_2SiCl_2$) may be provided at a rate of about 100 sccm, a germanium precursor comprising germane ($GeH_4$) may be provided at a rate of about 3 sccm, an etch gas comprising hydrogen chloride may be provided at a rate of about 100 sccm, and a dilutant/carrier gas comprising hydrogen ($H_2$) may be provided at a rate of about 25000 sccm.

Figure 2C:
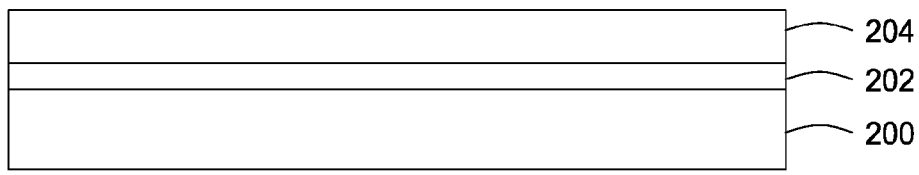

At 106, a silicon germanium bulk layer 204 (e.g., a second layer comprising silicon and germanium) is deposited atop the silicon germanium seed layer 202 (see FIG. 2C). The SiGe seed layer 202 may advantageously provide a smooth surface, thus facilitating uniform growth of a SiGe bulk layer having a smooth surface. The bulk layer 204 may be deposited at a second deposition rate between about 150 to 300 Angstroms/minute. In some embodiments, the second deposition rate of the SiGe bulk layer 204 is greater than the first deposition rate of the SiGe seed layer 202. The bulk layer 204 may be deposited to a thickness of between about 200 to about 1000 Angstroms. The concentration of germanium in the SiGe bulk layer 204 may be between about 10 to about 35 percent. In some embodiments, the concentration of germanium in the SiGe bulk layer 204 is the same as the concentration of germanium in the SiGe seed layer 202.

The silicon germanium bulk layer 204 is deposited atop the silicon germanium seed layer 202 using a second process gas mixture including a second silicon precursor gas and a germanium precursor gas at a pressure of about 5 to about 15 Torr and a temperature of about 700 to about 750 degrees Celsius. The second silicon precursor may be utilized for depositing the silicon element of the silicon germanium SiGe bulk layer 204. The second silicon precursor may comprise silicon and hydrogen. In some embodiments, the second silicon precursor may include at least one of silane ($SiH_4$), disilane ($Si_2H_6$), or the like. In some embodiments, the second silicon precursor comprises silane ($SiH_4$). The second silicon precursor may be combined with a germanium precursor for depositing the silicon germanium (SiGe) bulk layer 204. The germanium precursor may be any of the germanium precursors discussed above with respect to depositing the silicon germanium seed layer 202. In some embodiments, the germanium precursor comprises germane ($GeH_4$).

The second silicon precursor and the germanium precursor may be flowed simultaneously in a second process gas mixture, and utilized to form the SiGe bulk layer 204 atop the seed layer 202. The second process gas mixture may further comprises a dilutant/carrier gas and an etch gas. The dilutant/carrier gas may include any of the dilutant/carrier gases discussed above with respect to depositing the silicon germanium seed layer 202. In some embodiments, the dilutant/carrier gas comprises hydrogen ($H_2$). The etch gas may include any of the etch gases discussed above with respect to depositing the silicon germanium seed layer 202. In some embodiments, the etch gas comprises hydrogen chloride (HCl).

In some embodiments, the second process gas mixture for the deposition of the silicon germanium bulk layer 204 may be supplied at a total gas flow from about 9000 to about 35000 sccm, or at about 10000 sccm. The second process gas mixture may have a range of compositions. In some embodiments, the second process gas mixture may comprise between about 0.2 percent to about 1 percent of the second silicon precursor (e.g., a second silicon precursor flow of between about 20 to about 100 sccm). In some embodiments, the second process gas mixture may comprise between about 0.01 to about 0.05 percent of the germanium precursor (e.g., a germanium precursor flow of between about 1 to about 5 sccm). In some embodiments, the first process gas mixture may comprise between about 0.2 to about 2 percent of the etch gas (e.g., an etch gas flow of between about 20 to about 200 sccm). In some embodiments, the second process gas mixture may comprise between about 97 to about 99.9 percent of a dilutant/carrier gas. For example, in one specific embodiment, a second silicon precursor comprising silane ($SiH_4$) may be provided at a rate of about 50 sccm, a germanium precursor comprising germane ($GeH_4$) may be provided at a rate of about 3 sccm, an etch gas comprising hydrogen chloride may be provided at a rate of about 100 sccm, and a dilutant/carrier gas comprising hydrogen ($H_2$) may be provided at a rate of about 10000 sccm.

Upon completion of the deposition of the SiGe bulk layer 204, the silicon-containing compound layer is formed and the method 100 generally ends, although further processing may performed, as desired. For example, the SiGe bulk layer 204 may be etched or further planarized as necessary. In device applications, for example, when the SiGe layer is used as a source/drain region of a transistor device, contacts may be adhered to the smooth surface of the SiGe bulk layer 204. Such contacts may include, for example, a metal silicide layer.

The inventive methods disclosed herein may be performed in any suitable semiconductor process chamber adapted for performing epitaxial silicon deposition processes, such as the RP EPI reactor, available from Applied Materials, Inc. of Santa Clara, Calif. An exemplary process chamber is described below with respect to FIG. 3, which depicts a schematic, cross-sectional view of a semiconductor substrate process chamber 300 suitable for performing portions of the present invention. The process chamber 300 may be adapted for performing epitaxial silicon deposition processes and illustratively comprises a chamber body 310, support systems 330, and a controller 340.

The chamber body 310 generally includes an upper portion 302, a lower portion 304, and an enclosure 320. The upper portion 302 is disposed on the lower portion 304 and includes a lid 306, a clamp ring 308, a liner 316, a baseplate 312, one or more upper lamps 336 and one or more lower lamps 352, and an upper pyrometer 356. In some embodiments, the lid 306 has a dome-like form factor, however, lids having other form factors (e.g., flat or reverse curve lids) are also contemplated. The lower portion 304 is coupled to a process gas intake port 314 and an exhaust port 318 and comprises a baseplate assembly 321, a lower dome 332, a substrate support 324, a pre-heat ring 322, a substrate lift assembly 360, a substrate support assembly 364, one or more upper lamps 338 and one or more lower lamps 354, and a lower pyrometer 358. Although the term "ring" is used to describe certain components of the process chamber 300, such as the pre-heat ring 322, it is contemplated that the shape of these components need not be circular and may include any shape, including but not limited to, rectangles, polygons, ovals, and the like.

During processing, the substrate 200 is disposed on the substrate support 324. The lamps 336, 338, 352, and 354 are sources of infrared (IR) radiation (i.e., heat) and, in operation, generate a pre-determined temperature distribution across the substrate 200. The lid 306, the clamp ring 308, and the lower dome 332 are formed from quartz; however, other IR-transparent and process compatible materials may also be used to form these components.

The substrate support assembly 364 generally includes a support bracket 334 having a plurality of support pins 366 coupled to the substrate support 324. The substrate lift assembly 360 comprises a substrate lift shaft 326 and a plurality of lift pin modules 361 selectively resting on respective pads 327 of the substrate lift shaft 326. In one embodiment, a lift pin module 361 comprises an optional upper portion of the lift pin 328 is movably disposed through a first opening 362 in the substrate support 324. In operation, the substrate lift shaft 326 is moved to engage the lift pins 328. When engaged, the lift pins 328 may raise the substrate 200 above the substrate support 324 or lower the substrate 325 onto the substrate support 324.

The support systems 330 include components used to execute and monitor pre-determined processes (e.g., growing epitaxial silicon films) in the process chamber 300. Such components generally include various sub-systems. (e.g., gas panel(s), gas distribution conduits, vacuum and exhaust subsystems, and the like) and devices (e.g., power supplies, process control instruments, and the like) of the process chamber 300. These components are well known to those skilled in the art and are omitted from the drawings for clarity.

Figure 3:
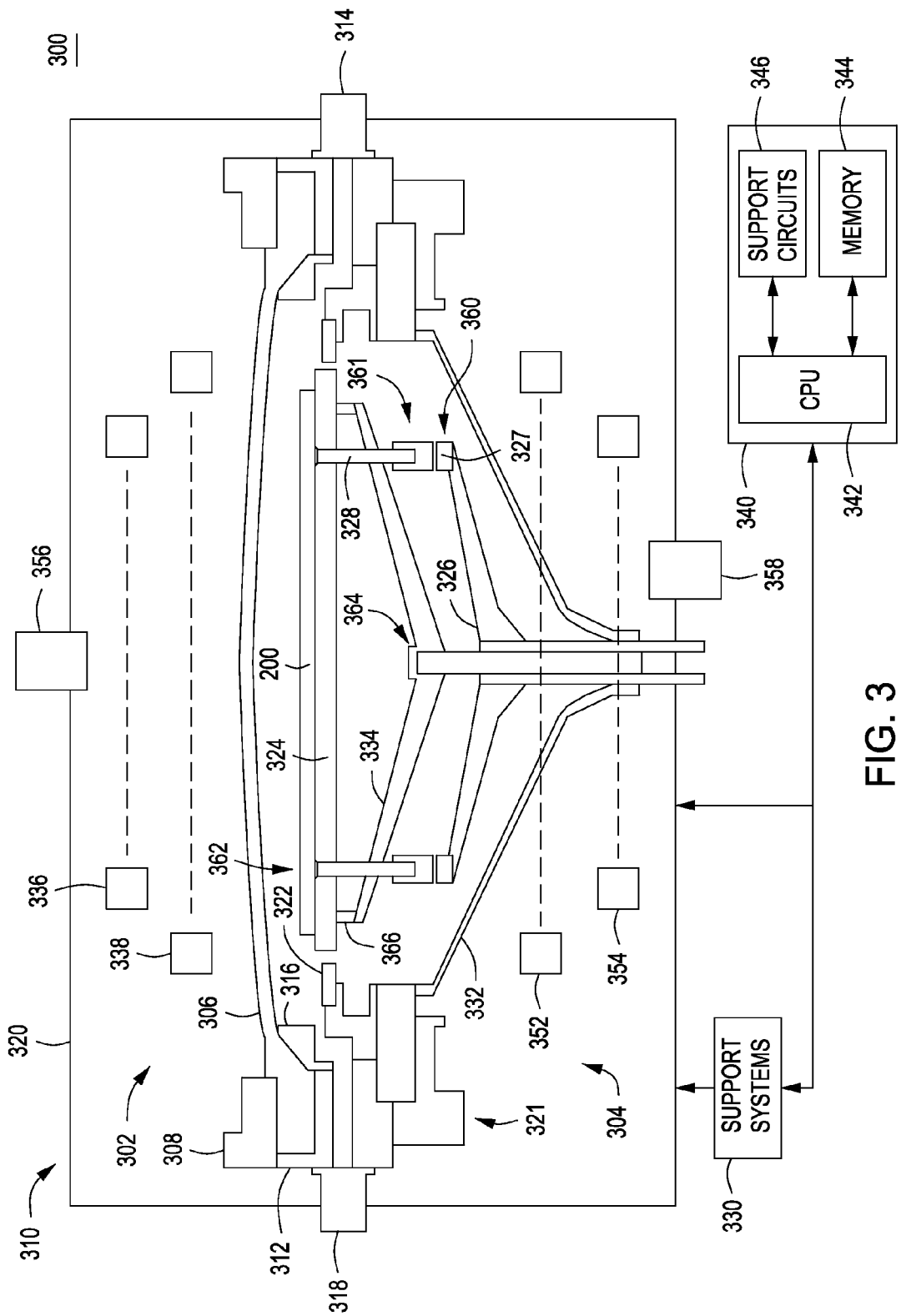
FIG. 3 depicts a schematic side view of a process chamber in accordance with some embodiments of the present invention.

The controller 340 generally comprises a Central Processing Unit (CPU) 342, a memory 344, and support circuits 346 and is coupled to and controls the process chamber 300 and support systems 330, directly (as shown in FIG. 3) or, alternatively, via computers (or controllers) associated with the process chamber and/or the support systems.

Thus, methods for depositing a silicon germanium layer on a substrate have been provided herein. The inventive methods advantageously facilitate the deposition of a SiGe layer at a high rate and having a smooth surface. The inventive methods further facilitate deposition of a SiGe layer having desired properties such as, for example, constant germanium concentrations throughout the film, improved balance of surface morphology and deposition rates, and the like.

While the foregoing is directed to embodiments of the present invention, other and further embodiments of the invention may be devised without departing from the basic scope thereof.

The invention claimed is:

1. A method for depositing a silicon germanium layer on a substrate, comprising:
    depositing a first layer comprising silicon and germanium atop the substrate using a first process gas mixture including a first silicon precursor comprising silicon and chlorine but not including a second silicon precursor consisting of silicon and hydrogen; and
    depositing a second layer comprising silicon and germanium atop the first layer using a second process gas mixture including the second silicon precursor but not including the first silicon precursor, wherein the first layer and the second layer form the silicon germanium layer.

2. The method of claim 1, wherein the first layer and the second layer are epitaxially grown.

3. The method of claim 1, wherein the first layer is deposited to a thickness of up to about 100 Angstroms.

4. The method of claim 1, wherein the second layer is deposited to a thickness of between about 200 to about 1000 Angstroms.

5. The method of claim 1, wherein the first silicon precursor gas comprises at least one of dichlorosilane ($H_2SiCl_2$), trichlorosilane ($HSiCl_3$), or silicon tetrachloride ($SiCl_4$).

6. The method of claim 1, wherein the second silicon precursor gas comprises at least one of silane ($SiH_4$) or disilane ($Si_2H_6$).

7. The method of claim 1, wherein the first silicon precursor gas is dichlorosilane and the second silicon precursor gas is silane.

8. The method of claim 1, wherein the substrate comprises silicon.

9. The method of claim 8, wherein a surface of the substrate is patterned.

10. The method of claim 9, wherein the first layer is deposited on an exposed silicon portion of the patterned substrate surface.

11. The method of claim 1, wherein the first layer is deposited at a first deposition rate and the second layer is deposited at a second deposition rate greater than the first deposition rate.

12. The method of claim 11, wherein the first deposition rate is between about 25 to about 150 Angstroms/minute.

13. The method of claim 11, wherein the second deposition rate is between about 150 to about 300 Angstroms/minute.

14. The method of claim 1, wherein the concentration of germanium in the first layer is between about 10 to about 35 percent, and wherein the concentration of germanium in the second layer is between about 10 to about 35 percent.

15. The method of claim 1, wherein the concentrations of germanium in the first layer and the second layer are substantially equal.

16. The method of claim 1, wherein at least one of the first process gas mixture and the second process gas mixture further comprises a dilutant/carrier gas.

17. The method of claim 16, wherein the dilutant/carrier gas comprises at least one of hydrogen ($H_2$), nitrogen ($N_2$), helium (He), or argon (Ar).

18. The method of claim 1, wherein at least one of the first process gas mixture and the second process gas mixture further comprises an etch gas.

19. The method of claim 18, wherein the etch gas comprises at least one of hydrogen chloride (HCl) or chlorine ($Cl_2$).

20. A method for depositing a silicon germanium layer on a substrate, comprising:
   depositing a first layer comprising silicon and germanium atop the substrate using a first process gas mixture including a single silicon precursor, wherein the single silicon precursor of the first process gas mixture comprises silicon and chlorine; and
   depositing a second layer comprising silicon and germanium atop the first layer using a second process gas mixture including a single silicon precursor, wherein the single silicon precursor of the second process gas mixture consists of silicon and hydrogen;
   wherein the first layer and the second layer form the silicon germanium layer.

* * * * *